United States Patent [19]

Chen et al.

[11] Patent Number: 5,216,268
[45] Date of Patent: Jun. 1, 1993

[54] FULL-FEATURED EEPROM

[75] Inventors: Ling Chen, Sunnyvale; Tien-ler Lin, Cupertino, both of Calif.

[73] Assignee: Integrated Silicon Solution, Inc., Sunnyvale, Calif.

[21] Appl. No.: 764,013

[22] Filed: Sep. 23, 1991

[51] Int. Cl.[5] .................... H01L 29/68; H01L 29/10; G11C 11/34
[52] U.S. Cl. .................................. 257/315; 365/185; 257/408
[58] Field of Search ............. 357/23.5, 23.3, 23.14, 357/59; 365/185; 257/315, 408

[56] References Cited

U.S. PATENT DOCUMENTS

| 5,079,603 | 1/1992 | Komori et al. | 357/23.5 |
| 5,101,250 | 3/1992 | Arima et al. | 357/23.5 |

*Primary Examiner*—Mark V. Prenty
*Attorney, Agent, or Firm*—Skjerven, Morrill, MacPherson, Franklin & Friel

[57] ABSTRACT

Disclosed is a byte-erasable EEPROM memory cell which utilizes a five volt external source and a voltage multiplier circuit to program and erase a floating gate by means of electron tunneling. To prevent collapse of the voltage multiplier circuit a lightly doped drain region is incorporated preventing gate modulated junction breakdown, thereby preventing collapse of the voltage multiplier circuit. In addition, current flow through the channel separating a source region and the lightly doped drain region is controlled by a portion of a control gate and the floating gate, thereby allowing a higher erased cell threshold voltage. Also disclosed is a process for forming the lightly doped drain region by using the control gate as an effective sidewall spacer.

3 Claims, 3 Drawing Sheets

FULL-FEATURED EEPROM

BACKGROUND OF THE INVENTION

1. Field of the Invention

This invention relates to electrically erasable programmable read-only memory (EEPROM) cells, and more particularly to byte-erasable ("full-featured") EEPROM cells.

2. Description of the Prior Art

With conventional byte-erasable EEPROM cells a problem exists in that conventional prior art byte-erasable cells require a high external voltage source to program and erase a floating gate.

A typical prior art byte-erasable EEPROM cell has been described in an article entitled "A High Density Floating Gate EEPROM Cell" by John R. Yeargain et al., which appeared in IEDM, 1981. (Note that the erase/program convention of the article is the reverse of the description prior art EEPROM cell, below.)

FIG. 1 illustrates in simplified and greatly enlarged fashion a typical prior art byte-erasable EEPROM cell such as the described in the above-referenced article. The EEPROM cell contains a select transistor in series with a floating-gate memory transistor. Referring to FIG. 1, cell 1, shown in side view, is comprised of substrate 5 of semiconductor material having a P-type dopant. Formed in the upper surface 6 of substrate 5 is a first drain region 7a, a second drain region 7b and a source region 8, all made of highly doped N-type material. Channel region 9a extends between first and second drain regions 7a, 7b, and channel region 9b extends between adjacent edges of source region 8 and second drain region 7b. Upon surface 6 of substrate 5 is a first insulating layer 10, which may typically be silicon dioxide, first insulating layer 10 forming what is known as a gate oxide. The first insulating layer 10 has a thickness of approximately 200 Å. Formed over first insulating layer 10 are floating gate 2 and select gate 4, both typically composed of polycrystalline silicon (polysilicon). As will be appreciated by reference to FIG. 1, select gate is positioned over first channel region 9a and floating gate 2 is positioned over second channel region 9b. Select gate 4 has one edge overlapping first drain region 7a and another edge overlapping second drain region 7b. Floating gate 2 has one edge overlapping a portion of second drain region 7b and another edge overlapping source region 8. Formed over floating gate 2 is a second insulating layer 11, typically composed of polysilicon oxide. Control gate 3 is positioned over channel 9b and substantially rests on second insulating layer 11. Control gate 3 has one depending portion which overlaps a portion of source region 8 and a second depending portion which overlaps a portion of second drain region 7b, with the middle portion of control gate 3 disposed over floating gate 2.

In erasing cell 1, control gate 3 is grounded and approximately 20 volts is applied to the select transistor 4 and the first drain region 7a. The source region 8 is biased to approximately 5-10 volts. Under these conditions, erasing is accomplished by the tunneling of electrons from the floating gate 2 through the first insulating layer 10 in response to the high applied drain voltage. This manner of erasing is known in the art as Fowler-Nordheim tunneling.

Programming is also accomplished by Fowler-Nordheim tunneling. In programming cell 1, source region 8, second drain region 7b and substrate 5 are grounded and a reversible voltage of approximately 20 volts is applied to the select gate and the control gate 3. Under these conditions, electrons tunnel from the source region 8, second drain region 7b and substrate 5 through the first insulating layer 10 to the floating gate 2.

During a read function a potential of 5 volts is applied to the select transistor 4 and a voltage of 1 volt is applied to the second drain region 7b. Both the control gate 3 and the source region 8 are grounded. If a net positive charge exists in the floating gate 2 (i.e., an erase function has been performed on the floating gate) then the floating gate 2 will allow a current to flow through the channel 9 between the source region 8 and the second drain region 7b.

A problem with the prior art byte erasable EEPROM cell is that a high external voltage source is required for the erase and program function. To provide high voltages on a memory chip while using only a 5 volt external source, it is known in the art to use a voltage multiplier. However, if a voltage multiplier is used on the prior art byte-erasable EEPROM cell discussed above, a gate-modulated junction breakdown effect will cause the voltage multiplier to collapse. Gate-modulated junction breakdown occurs when electrons are drawn from the channel region surrounding the drain in response to the electric field generated by the floating gate. The large number of electrons drawn into the drain region from the channel region results in a high current flow. Because a voltage multiplier requires a low current to create a desired high voltage, the high current generated by the gate-modulated junction breakdown causes the voltage multiplier to collapse, causing failure of the cell.

In addition, the use of a voltage multiplier on the prior art byte-erasable EEPROM cell will limit the erased cell threshold voltage. The erased cell threshold voltage is the voltage level of the floating gate at which the channel is "turned on"; that is, enough current is allowed through the channel to sense the "erased" state of the floating gate. If the channel is "turned on" during an erase function (i.e., when enough electrons tunnel out of the floating gate to give it a net positive charge equal to the threshold voltage), then the additional DC current across the channel can collapse the voltage multiplier. This limits the erased cell threshold voltage. If the erase cell threshold voltage is limited, then the cell current during a "read" operation will be small, which makes sensing the erased or programmed state of the floating gate more difficult. Moreover, the process and circuit parameter variations will greatly reduce the yield of the memory product.

SUMMARY OF THE INVENTION

It is an object of the invention to provide a byte-erasable memory cell having improved programming and erasing performance.

A further object of the invention is to provide a byte-erasable EEPROM cell requiring only a 5 volt source.

A further object of the invention is to provide a byte-erasable EEPROM cell requiring only a 5 volt source which has a high erased cell threshold voltage.

A further object of the invention is to provide a method for producing a byte-erasable EEPROM cell using only a 5 volt source.

In accordance with the present invention, a nonvolatile memory cell is provided comprising a substrate, charge storing means disposed adjacent the substrate, and a first doped region disposed in the substrate, the first doped region having a lightly doped portion and a heavily doped portion.

Also in accordance with the present invention, a nonvolatile memory cell is provided comprising a substrate, a first doped region disposed in the substrate, a second doped region disposed in the substrate and spaced from the first doped region, the space between the first and second doped regions being a channel, a charge storing body disposed adjacent the first doped region and having a portion disposed adjacent the channel, and a conductive body disposed adjacent the second doped region and having a portion disposed adjacent the channel, the cell characterized in that current passes through the substrate from the first doped region to the second doped region only when the charge storing and conductive bodies are at predetermined potentials.

Also in accordance with the present invention, a method of producing a nonvolatile memory cell is provided comprising forming a charge storing body adjacent a substrate, doping a region of the substrate to a first resistivity, masking a first portion of the doped region of the substrate with a conductive body, and doping a second portion of the doped region of the substrate to a second, lower resistivity.

Also in accordance with the present invention, a byte-erasable EEPROM cell is provided comprising a body of semiconductor material of first conductivity type; a first and second drain (doped) region and a source (doped) region of second conductivity type extending into the body from an upper surface, the second drain having a lightly doped portion and a heavily doped portion; a first channel region disposed between the first drain region and the second drain region, and a second channel region disposed between the second drain region and the source region; a first layer of insulating material of a first thickness on the surface of the body above the source, first drain, second drain, and channel regions; a select gate disposed on the first layer of insulating material above the first channel region; a floating gate (charge storing body) disposed on the first layer over a first portion of the second channel region, one end of the floating gate disposed over the lightly doped portion of the second drain region; a second layer of insulating material covering the floating gate; and a control gate (conductive body) having a first section disposed over the floating gate and a second section disposed over a second portion of the second channel region; wherein the floating gate is erased by charging the second drain with a high voltage thereby causing electrons to leave the floating gate by means of Fowler-Nordheim tunneling.

Also in accordance with a further feature of the present invention, a process is provided for producing a nonvolatile memory cell utilizing a body of semiconductor material of first conductivity type, the nonvolatile memory cell including a floating gate supported on a first layer of insulating material disposed on a surface of the body of semiconductor material, the improved process for forming a region of second conductivity type in the body adjacent to an edge of the floating gate wherein the region has a first resistivity immediately adjacent to the edge of the floating gate and a second, lower resistivity spaced away from the edge, the process comprising forming the first insulating layer on a surface of the body of semiconductor material; forming the floating gate on the first insulating layer; forming a first region of second conductivity type, having a first resistivity, in the body of semiconductor material adjacent the floating gate; forming a second insulating layer over the first insulating layer and the floating gate; forming a control gate over the second insulating layer above the floating gate, with the control gate including a depending portion substantially covering the first region of second conductivity type having the first resistivity; forming in the body of semiconductor material a second region of second conductivity type having a second, lower resistivity than the first region adjacent the control gate using the control gate as a sidewall spacer to preserve the resistivity of the first region of second conductivity type, the second region of second conductivity type disposed to contact the first region of second conductivity type.

BRIEF DESCRIPTION OF THE DRAWINGS

Other objects and advantages of the invention will become apparent from a study of the specification and drawings in which.

DETAILED DESCRIPTION OF THE INVENTION

A. Description of the Cell

Figure 1:
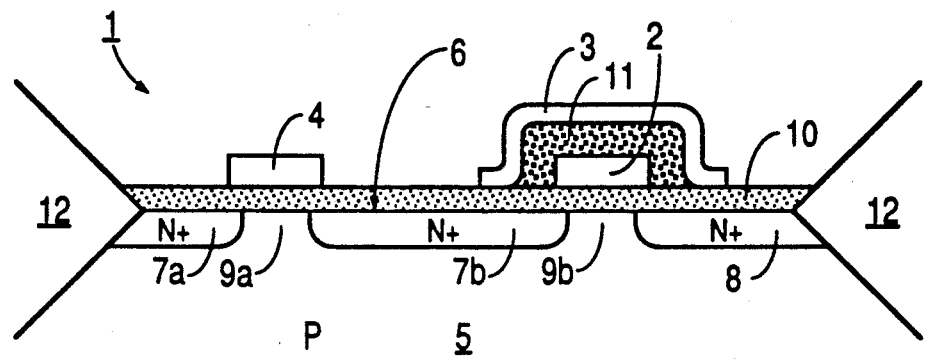
FIG. 1 is a side view of a prior art byte-erasable memory cell.
Figure 2:
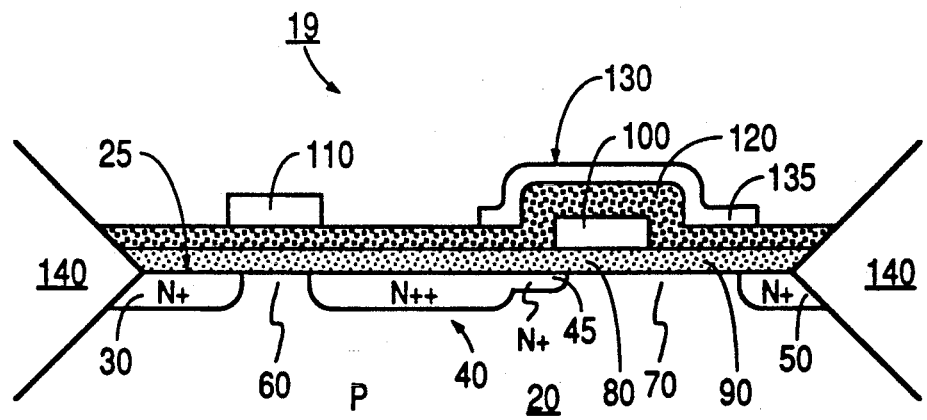
FIG. 2 is a side view of a byte-erasable cell of the present invention.

Referring to FIG. 2, memory cell 19 according to the present invention is illustrated in side view and in highly enlarged version for the purposes of illustration. Memory cell 19 is situated on a P-type substrate 20 preferably comprised of a monocrystalline semiconductor material having a resistivity of about 1 to 10 $\Omega$-cm. Upper surface 25 is in the <100> crystallographic orientation plane. Field oxide regions 140 are grown as is known in the art and disposed around the boundary of memory cell 19. Source (doped) region 50, first drain (doped) region 30, located under select gate 110, and second drain (doped) region 40, located under floating gate (charge storing body) 100, are implanted in substrate 20 through the upper surface 25 in a manner discussed below. With the exception of lightly doped drain region 45, the remainder of second drain region 40, first drain region 30 and source region 50 are of highly doped N-type material.

Disposed on the surface 25 is a first oxide layer 90 and a thin tunneling oxide region 80. Above the thin tunneling oxide region 80 is disposed floating gate 100. As shown in FIG. 2, the floating gate 100 is disposed over second channel region 70, with one end of the floating gate 100 positioned over one end of the lightly doped drain region 45 of the second drain region 40.

Disposed over first channel region 60 is a select gate 110, made of polycrystalline silicon material. As shown in FIG. 2, one end of the select gate 110 is situated over one end of first drain region 30 and other end over second drain region 40.

Disposed over the floating gate 100 is a second oxide layer 120. Above the second oxide layer 120 is a control gate (conductive body) 130 made of polycrystalline silicon material. One depending end of control gate 130 is positioned over one end of the second drain region 40 near the junction between the lightly doped drain portion 45 and the second drain region 40. The other depending end of control gate 130 extends over a portion of the second channel region 70. This portion of control gate 130 is designated as the phantom transistor portion 135, for reasons which will become evident below.

B. Operation of Cell

1. Programming

In programming the memory cell 19 a DC voltage (approximately 20 volts) is applied to the select gate 110 and the control gate 130. The second drain region 40, the substrate 20 and the source region 50 are grounded. The floating gate 100 acquires a net negative charge by capturing electrons which are drawn through the thin tunneling oxide 80 from the second channel region 70, source region 50 and second drain region 40 by the potential between the substrate 2 and the control gate 130. Electrons are captured by the floating gate 100, thereby giving it a net negative charge.

2. Erasing

In erasing the memory cell 19, a high voltage of approximately 20 volts is applied to the select gate 110 and the second drain region 40. The control gate 130 is set to ground and the source region 50 is set to float. Under these conditions the electrons trapped in the floating gate 100 are attracted to the high potential in the second drain region 40. The electrons tunnel through the thin tunneling oxide 80 to the lightly doped drain region 45 and pass into the second drain region 40. Because a high voltage is applied to the select gate 110, the electrons are allowed to pass through the first channel region 60 to the cell drain region 30.

In accordance with the present invention the high voltage applied to the second drain region 40 is generated by a voltage multiplier in a manner known in the art. As discussed above, the field generated by the floating gate 100 causes a gate-modulated junction breakdown in a portion of the second drain region 40 located under the floating gate 100. Because the present invention incorporates a lightly doped drain region 45, the occurrence of gate-modulated junction breakdown is minimized. This minimization occurs because the portion of the second drain region 40 affected by the electric field generated by the floating gate 100 is limited to the lightly doped drain region 45. Because the gate-modulated junction breakdown effect is limited to the lightly doped drain region 45, the flow of electrons passing from the substrate 20 to the second drain region 40 is kept low, due to the light doping. The limited flow of electrons into the lightly doped drain region 45 thereby prevents collapse of the voltage multiplier.

Also in accordance with the present invention, because the control gate 130 is grounded during the erase function, the phantom transistor portion 135 is turned off. Because the phantom transistor portion 135 is off, the portion of second channel region 70 does not permit current to flow from source region 50 to second drain region 40. This blockage of current flow occurs despite the charge on floating gate 100; that is, even if the charge on floating gate 100 during an erasing function reaches a positive potential equal to or greater than the erased cell threshold voltage, DC current flow from the source region 50 to second drain region 40 is prevented by the effective transistor formed by phantom transistor portion 135. With this phantom transistor feature, the present invention has the advantage over the prior art of allowing a higher erased cell threshold voltage because erasing can continue even if the channel under the floating gate has been turned on, thereby facilitating easier sensing of the state of the floating gate 100.

3. Reading

When it is desired to read the memory cell 19, a potential of 5 volts is applied to the select gate 110, a potential of 2 volts is applied to the second drain region 40 and the control gate 130, and the source region 50 is grounded. If a net positive charge resides on the floating gate 100, current is allowed to pass from the source region 50 through the second channel region 70 to the second drain region 40. This occurs because the 2 volt charge on the control gate 130 activates the phantom transistor portion 135, thereby allowing current to pass through the second channel 70 portion located directly under the phantom transistor portion 135. In addition, because of the net positive charge on the floating gate 100, current is allowed to pass through the second channel 70 located under the floating gate 100. If current is allowed to flow from the source region 50 to the second drain region 40, then it is allowed to flow to the first drain region 30 because of the 5 volt charge applied to the select gate 110.

If a net negative charge resides on the floating gate 100, then the portion of the second channel 70 located under the floating gate 100 will not allow a current to pass from the source region 50 to the second drain region 40.

C. Process for Producing the Cell

Figure 3A:
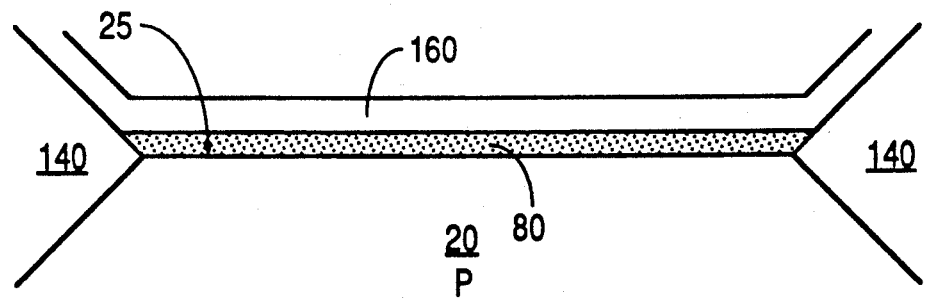
FIGS. 3A to 3E illustrate the process utilized in the invention for producing the lightly doped region utilized in the erase mode.
Figure 3B:
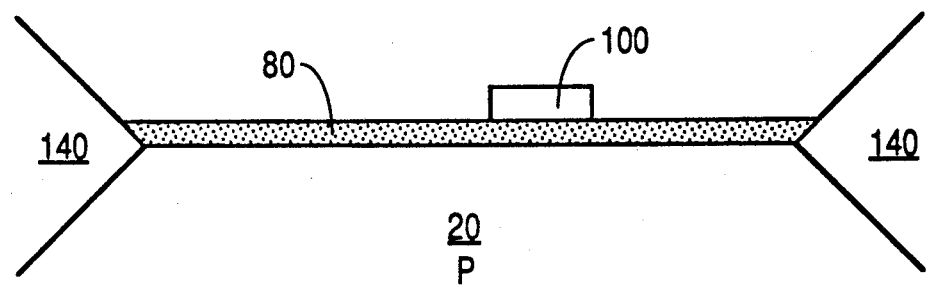
Figure 3C:
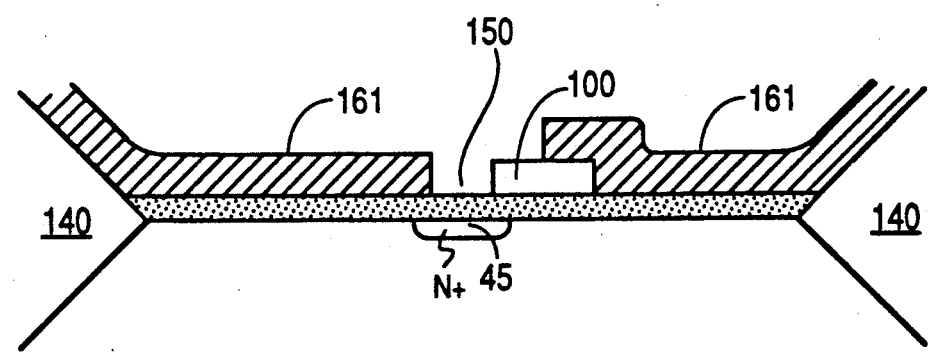
Figure 3D:
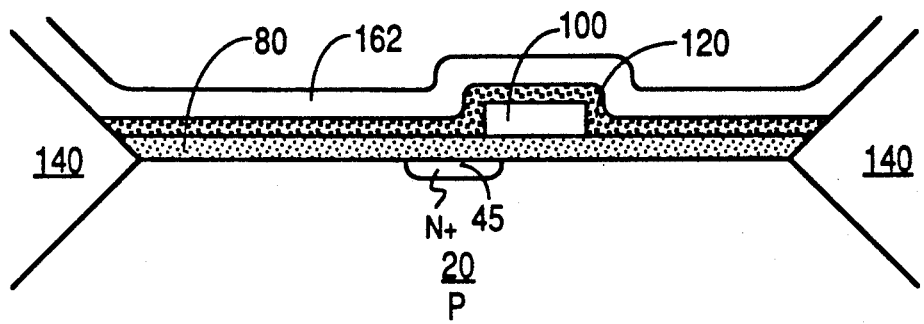
Figure 3E:
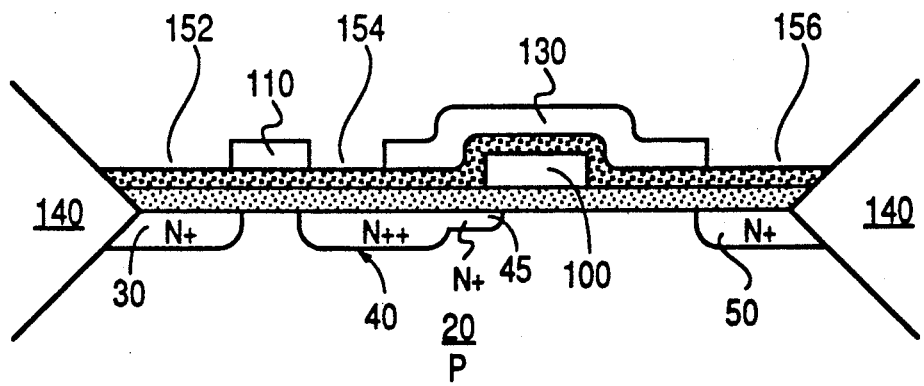

The preferred process for producing memory cell 19 will be illustrated in the following FIGS. 3A to 3E. As shown in FIG. 3A, a substrate 20 having a resistivity of 1 to 10 ohm-cm and doped with boron is provided. Using techniques known in the art, field oxide regions 140 are grown to a thickness of 7000 Å as shown in FIG. 3A. Upon the surface 25 of the substrate 20 is then grown a thin oxide layer 80 approximately 100 to 120 Å in thickness via the process of thermal oxidation of silicon substrate 20. Over thin oxide layer 80 is deposited using LPCVD a first poly-crystalline silicon layer 160 doped with phosphorus or arsenic using doping techniques of ion implantation and having a thickness of approximately 3700 Å. This layer is then masked and plasma etched with chlorine gas etchant manufactured by Matheson at 45° C., and is then removed using techniques taught by the manufacturer, leaving the floating gate 100 as shown in FIG. 3B. As shown in FIG. 3C, the cell is then masked and photoresist 161 manufactured by Shipley deposited over all areas leaving hole 150. Lightly doped drain region 45 is then created using arsenic or phos-phorous ions to provide a doping concentration of about $10^{17}10^{18}$ atoms/cm$^3$. The photoresist 161 is then removed using techniques taught by the manufacturer and a second oxide layer 120 is grown over thin oxide layer 80 and above the surface of the lightly doped drain region 45, floating gate 100, and the remainder of the substrate surface 25 to a thickness of 300 to 500 Å as shown in FIG. 3D. The preferable process for growing second oxide layer 120 is either thermal oxidation of silicon or chemical vapor deposition of silicon dioxide. Upon the second oxide layer 120 is deposited a second poly-crystalline silicon layer 162 (using the same technique described above with respect to the first polycrystalline layer 160) doped with phosphorus or arsenic and having a thickness of about 3700 Å. The cell is then masked with a photoresist and plasma etched with chlorine gas etchant manufactured by Matheson, thereby defining the control gate 130 and the select gate 110 as shown in FIG. 3E. Removal of the unmasked portions of polycrystalline silicon layer 120 provides openings 152, 154 and 156. The substrate surface located under these openings is then heavily doped to a concentration of about $10^{21}$ atoms/cm$^3$ using arsenic or phosphorous ions thereby forming first drain region 30, second drain region 40, and source region 50. It will be appreciated that the control gate 130 is used as an "effective sidewall spacer," preventing the lightly doped drain region 45 from becoming heavily doped. The use of the control gate 130 as an effective sidewall spacer differs from prior art processes for creating lightly doped drains in that overlap of the floating gate 100 and the heavily doped portion of second drain region 40 is avoided, thereby preventing gate-modulated junction breakdown.

Once the first drain region 30, second drain region 40 and source region 50 have been doped, an oxide layer is deposited over the cell to a thickness of 1 μm using the CVD process, then metallization techniques are used to provide leads to the drain, source and control gate.

The foregoing process is illustrative of a preferred method for providing a lightly doped drain region which is incorporated into our invention. This process may be used in the production of other cells using this design.

We claim:

1. A nonvolatile memory cell comprising:
   a substrate;
   means for storing an electric charge disposed adjacent said substrate and separated by a first insulating layer;
   a first doped region disposed in said substrate, said first doped region having a lightly doped portion disposed adjacent said charge storing means and a heavily doped portion;
   a second doped region disposed in said substrate and spaced from said first doped region, the space between said first doped region and said second doped region defining a channel, a portion of said charge storing means being disposed adjacent a first portion of said channel; and
   a conductive body disposed adjacent said second doped region and a second portion of said channel;
   wherein current passes through said first channel portion only when said charge storing means is at a first predetermined potential and current passes through said second channel portion only when said conductive body is at a second predetermined potential.

2. A nonvolatile memory cell comprising:
   a substrate;
   a first doped region disposed in said substrate;
   a second doped region disposed in said substrate and spaced from said first doped region, the space between said first and second regions defining a channel;
   a charge storing body disposed adjacent said first doped region and having a portion disposed adjacent said channel; and
   a conductive body disposed adjacent said second doped region and having a portion disposed adjacent said channel;
   wherein current passes through said substrate from said first doped region to said second doped region only when said charge storing and conductive bodies are at predetermined potentials; and
   wherein said first doped region comprises a heavily doped portion and a lightly doped portion, said lightly doped portion being disposed between said channel and said heavily doped portion.

3. A nonvolatile memory cell comprising:
   a body of semiconductor material of first conductivity type;
   first, second and third doped regions, each of second conductivity type, extending into said body from a surface, said second doped region having a lightly doped portion and a heavily doped portion;
   a first channel region disposed between said first doped region and said second doped region, and a second channel region disposed between said second doped region and said third doped region;
   a first layer of insulating material of a first thickness on said surface above said source, first, second, and third doped regions;
   a select gate disposed on said first layer above said first doped region;
   a floating gate disposed on said first layer over a first portion of said second doped region, one end of said floating gate disposed over said lightly doped portion of said second doped region;
   a second layer of insulating material covering said floating gate; and
   a control gate having a first section disposed over said floating gate and a second section disposed over a second portion of said second doped region;
   wherein said floating gate is erased by charging said second doped region with a high voltage.

* * * * *